United States Patent
Hirsch et al.

(10) Patent No.: US 11,081,616 B2
(45) Date of Patent: Aug. 3, 2021

(54) METHOD FOR PRODUCING A CDTE SOLAR CELL

(71) Applicant: Fraunhofer-Gesellschaft zur Förderung der angewandten Forschung e.V., Munich (DE)

(72) Inventors: Daniel Hirsch, Dresden (DE); Olaf Zywitzki, Dresden (DE); Thomas Modes, Dresden (DE); Torsten Werner, Dresden (DE); Torsten Kopte, Dresden (DE); Christoph Metzner, Dresden (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/422,008

(22) Filed: May 24, 2019

(65) Prior Publication Data
US 2019/0371958 A1    Dec. 5, 2019

(30) Foreign Application Priority Data

Jun. 4, 2018 (DE) ............... 10 2018 113 251.4

(51) Int. Cl.
*H01L 31/18* (2006.01)
*H01L 31/0296* (2006.01)
(Continued)

(52) U.S. Cl.
CPC ...... *H01L 31/1868* (2013.01); *C23C 14/0629* (2013.01); *C23C 14/24* (2013.01);
(Continued)

(58) Field of Classification Search
CPC ............. H01L 31/1828; H01L 31/0296; H01L 27/14696; H01L 31/0445; H01L 31/02966;
(Continued)

(56) References Cited

U.S. PATENT DOCUMENTS 5,501,744 A * 3/1996 Albright ......... H01L 31/022425
136/244
6,221,495 B1 * 4/2001 Wu ..................... C03C 17/00
204/192.12
(Continued)

FOREIGN PATENT DOCUMENTS

WO  WO 2014/184661 A2  11/2014
WO  WO 2015/126918 A1  8/2015

OTHER PUBLICATIONS

Jason M. Kephart et al., "Sputtered, Oxygenated CdS Window Layers for Higher Current in CdS/CdTe Thin Film Solar Cells," 2012 38th IEEE Photovoltaic Specialists Conference, dated Jun. 3, 2012, pp. 1-5, published by IEEE, Austin, TX.
(Continued)

*Primary Examiner* — Ahmed N Sefer
(74) *Attorney, Agent, or Firm* — Brinks Gilson & Lione

(57) ABSTRACT

A method for producing a CdTe solar cell is provided, wherein at least the following layers are deposited on a glass substrate within a vacuum chamber: a TCO layer acting as a frontal contact; at least one CdTe layer; a thin layer of a chlorine-containing compound, and an electrically conductive layer acting as a return contact. Here, a maximally 20 nm thick passivation layer made from CdS, in which chemically non-bound oxygen is embedded, is deposited on the TCO layer prior to deposition of at least one CdTe-layer.

2 Claims, 1 Drawing Sheet

(51) Int. Cl.
*H01L 31/072* (2012.01)
*C23C 14/24* (2006.01)
*H01L 31/0392* (2006.01)
*C23C 14/06* (2006.01)

(52) U.S. Cl.
CPC .... *H01L 31/0296* (2013.01); *H01L 31/03925* (2013.01); *H01L 31/072* (2013.01); *H01L 31/18* (2013.01); *H01L 31/1828* (2013.01); *H01L 31/1836* (2013.01); *Y02E 10/543* (2013.01)

(58) Field of Classification Search
CPC ............ H01L 21/324; H01L 21/02631; H01L 21/02315; H01L 31/1868; C23C 16/306; C23C 14/0021; C23C 14/562; C23C 14/0629; C23C 14/02
See application file for complete search history.

(56) References Cited

U.S. PATENT DOCUMENTS

| | | | |
|---|---|---|---|
| 2005/0009228 A1* | 1/2005 | Wu | C23C 14/0629 438/95 |
| 2010/0055827 A1* | 3/2010 | Barth | H01L 21/67005 438/94 |
| 2010/0261304 A1* | 10/2010 | Chang | H01L 21/02568 438/72 |
| 2011/0259424 A1* | 10/2011 | Basol | H01L 21/02474 136/260 |
| 2012/0164784 A1* | 6/2012 | Feldman-Peabody | H01J 37/32899 438/84 |
| 2013/0019948 A1 | 1/2013 | Feldman-Peabody | |
| 2014/0216550 A1* | 8/2014 | Damjanovic | H01L 31/02966 136/260 |
| 2015/0075615 A1* | 3/2015 | Ihara | H01L 31/049 136/259 |
| 2016/0308086 A1* | 10/2016 | Velappan | H01L 31/186 |

OTHER PUBLICATIONS

W. K. Metzger et al., "CdCl$_2$ treatment, S diffusion, and recombination in polycrystalline CdTe," Journal of Applied Physics, dated Jan. 1, 2006, pp. 1-7, vol. 99, Issue 1, published by the American Institute of Physics, Melville, NY.

B. Siepchen et al., "Thin film CdTe solar cells by close spaced sublimation: Recent results from pilot line," Thin Films, dated May 15, 2013, pp. 224-228, vol. 535, published online by Elsevier at URL https://doi.org/10.1016/j.tsf.2012.11.083.

* cited by examiner

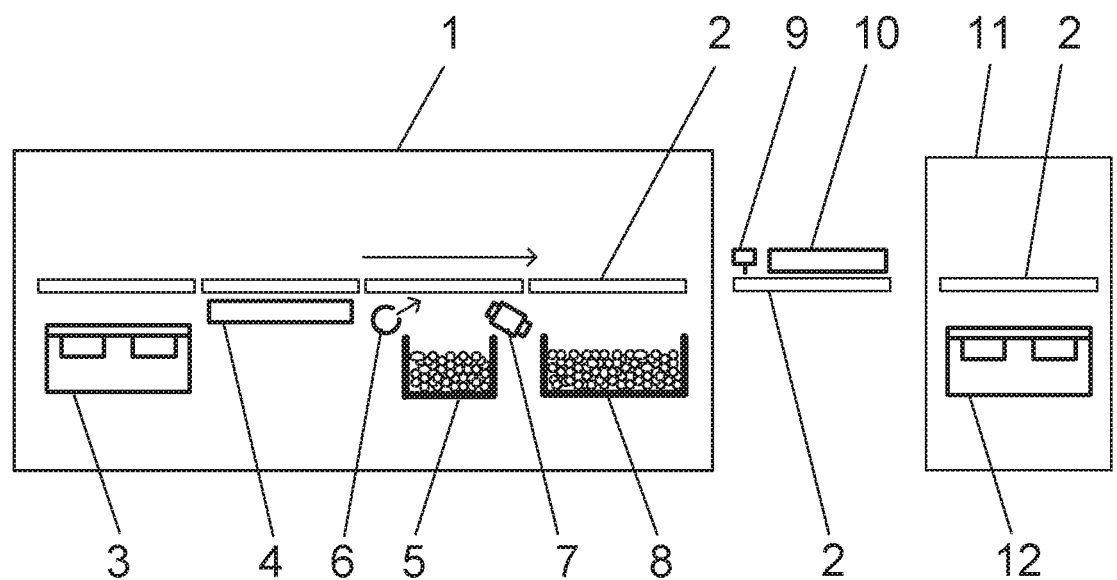

METHOD FOR PRODUCING A CDTE SOLAR CELL

CROSS-REFERENCE TO RELATED APPLICATIONS

This application claims priority under 35 USC § 119 to German Patent Application No. 10 2018 113 251.4, filed Jun. 4, 2018, which is hereby incorporated by reference.

BRIEF DESCRIPTION OF THE DRAWINGS

FIG. 1 shows a device that is suitable for the execution of the method according to the invention.

DESCRIPTION

The invention relates to a method for producing a CdTe solar cell in which a glass substrate is used as a frontal carrier material.

CdTe thin-layer solar cells are preferably produced in the so-called superstrate configuration, in which a glass pane is used as a frontal substrate, with light first penetrating it before reaching the layers of the solar cell deposited at the back of the glass substrate.

One such solar cell comprises, in the simplest structure, a transparent and electrically conductive oxide layer (based on the English technical term "transparent conductive oxide" also called TCO-layer) acting as the frontal contact, which is deposited first on the glass substrate. Subsequently, at least one other absorbing layer made from CdTe and an electrically conductive layer acting as a return contact are deposited [B. Siepchen et al., Thin film CdTe solar cells by close spaced sublimation: Recent results from pilot line, Thin Solid Films 535 (2013) 224-228].

It is known to deposit a CdS-layer between the TCO layer and the CdTe layer in order to passivate the boundary surface between the TCO layer and the CdTe layer, which shows many defects, and thus reduce the recombination of charge carriers [W. K. Metzger et al., $CdCl_2$ treatment, S diffusion, and recombination in polycrystalline CdTe, Journal of Applied Physics 99, 103703 (2006)]. As a result, a greater open-circuit voltage can be achieved in a solar cell. Because the light impinging such a solar cell must first pass through the CdS layer before it penetrates into the CdTe layer, such a layer between the TCO and the CdTe layer is also called a window layer. A disadvantage here is that such a CCS layer also parasitically absorbs parts of the incident light. This reduces the number of photons that can be absorbed in the CdTe. Therefore, such a CdS layer reduces the achievable photocurrent of a solar cell.

Also known is a so-called chlorine activation of the layer system of a CdTe solar cell. Here, a thin layer of a chlorine-containing compound, such as $CdCl_2$, is applied on the deposited CdTe-layer, and the entire layer compound deposited on the glass substrate at this point of time is heated to a temperature of approximately 400° C. In the process, chlorine diffuses into the CdTe layer, which has a positive effect on the quality of the crystalline structure of the CdTe layer and the CdS—CdTe boundary surface.

The CdS layer can be replaced by materials with a higher band gap, which increases the transparency of the window layer. Thus, materials such as oxide-rich CdS (CdS:O) [J. M. Kephart et al., Sputtered, Oxygenated CdS Window Layers for Higher Current in CdS/CdTe Thin Film Solar Cells, Proc. $38^{th}$ IEEE photovoltaic spec. Conf., (2012), pp. 854-858] and cadmium zinc sulfide CdZnS are used for the window layer, but these materials are not stable and usually a phase separation occurs already during chlorine activation.

The invention is therefore based upon the technical challenge of creating a method for producing a CdTe-solar cell, by which the disadvantages of the prior art can be overcome. In particular, a CdTe solar cell produced according to the invention should have a high open-circuit voltage and a high photocurrent.

The method according to the invention initially comprises a few method steps known from the prior art to produce a CdTe solar cell. Here, in the method according to the invention, at least the following layers are also deposited on a glass substrate within a vacuum chamber: first, a TCO layer acting as a frontal contact; at least one CdTe layer; a thin layer of a chlorine-containing compound and an electrically conductive layer as a back contact, wherein during the deposition of the CdTe-layer and after the deposition of the thin layer of a chlorine-containing compound, a heating of the previously formed composite comprising the glass substrate and the layers deposited thereon.

According to the invention, however, before the deposition of at least one CdTe-layer, a maximum of 20 nm thick passivation layer of CdS, in which chemically non-bound oxygen is embedded, is deposited on the TCO layer.

The deposition of a thin passivation layer, which is at most 20 nm thick, leads to the fact that incident light on the solar cell is only insignificantly absorbed by the passivation layer, which increases the photocurrent of a solar cell produced according to the invention.

The small thickness of the passivation layer, in which chemically non-bound oxygen is embedded, also causes the layer material CdS to agglomerate during the so-called chlorine activation (i.e. the deposition of a chlorine-containing compound on the CdTe layer with the subsequent heating of the composite comprising glass substrate and the layers deposited thereon). At the interface between the TCO layer and the CdTe layer, areas are thus formed in which the layer material CdS is present in an agglutinated form and other areas in which only oxygen, previously stored in the CdS layer material, impacts a boundary surface between the TCO layer and the CdTe layer. The oxygen then causes the passivation of defects on the boundary surface, preventing the recombining of charge carriers and thus ensures a high open-circuit voltage of a solar cell produced according to the invention. A solar cell produced according to the invention is therefore characterized by a high photocurrent and high open-circuit voltage.

The same positive effects can alternatively be achieved without any CdS layer deposition if the surface of the TCO layer deposited as frontal contact is impinged with an oxygen plasma before the CdTe layer is deposited.

The embedding of chemically non-bound oxygen into a CD layer is possible, for example, if CdS is sublimated in the presence of oxygen plasma by means of an evaporation device and the steam developing from this is deposited on a substrate. Oxygen plasma means that oxygen is introduced into a vacuum chamber and simultaneously a plasma is generated within the vacuum chamber. It would have been expected that the deposition of CdS within a vacuum chamber in the presence of an oxygen plasma leads to a layer material which also contains an oxide, i.e. that the oxygen forms a chemical bond with the layer material. However, it has instead surprisingly shown that the sublimation of CdS in the presence of an oxygen plasma and the precipitation of the steam resulting therefrom leads to a layer material on a substrate in which the oxygen is embedded in the layer material without entering into a chemical composition. The plasma can be generated by means of a glow discharge or an arc discharge.

The present invention is explained in greater detail below with reference to one exemplary embodiment. FIG. 1 shows a device that is suitable for the execution of the method according to the invention. Within vacuum chamber 1, a plurality of glass substrates 2 should be provided with a part of the layers of a CdTe solar cell layer system. The horizontal arrow above the glass substrate 2 displays its direction of movement. Using coating device 3, a layer that is acting as a frontal contact is first deposited from a transparent, electrically conductive material (TCO layer) on the glass substrate 2. For this, all deposition processes and materials known from the prior art are suitable for applying a frontal contact layer. A heating of the TCO layer and glass substrate 2 to approximately 500° C. is then done by means of a heating device 4, which can be configured as a radiation heater, which is also known from the prior art.

According to the invention, CdS is then thermally heated by means of a coating device 5, whereby the CdS material is sublimated and simultaneously both by means of an inlet 6 oxygen is inserted into the vacuum chamber 1 as well as a plasma is generated by means of a hollow cathode 7, whereby an oxygen plasma is provided. The sublimation of CdS in the presence of an oxygen plasma and the precipitation of the steam resulting therefrom lead to the oxygen being stored unbound in the CdS layer. The resulting passivation layer is formed with a layer thickness of maximally 20 nm.

Using a coating device 8, a CdTe layer or several CdTe partial layers are deposited on the CdS layer with embedded unbound oxygen according to the prior art. This is followed by a chlorine activation also known from the prior art. For this purpose, the substrate 2 is removed from the vacuum chamber 1 and turned over, thus turned with the bottom facing up, and a chlorine-containing compound is applied to the CdTe layer using a device 9. The chlorine-containing compound can, for example, be $CdCl_2$ powder dissolved in methanol. Using the device 9, then a liquid film of this solution is applied to the CdTe layer. The methanol evaporates from the applied solution so that a thin $CdCl_2$ layer remains on the CdTe layer. Using a heating device 10, the composite comprising glass substrate 2 and the layers deposited thereon, is heated, resulting in chlorine to diffuse into the CdTe layer. This is accompanied by an agglomeration (i.e. a partial accumulation) of the CdS layer material, leading to the advantages described above.

After the underside of the substrate 2 has been turned upwards once more, then an electrically conductive material is deposited as a return contact within a vacuum chamber 11 by means of a coating device 12 according to the prior art.

The method according to the invention is not limited to the procedure described above. For example, all described deposition processes can be carried out inside a vacuum chamber. Alternatively, the layers of a CdTe solar cell layer system can also be deposited within more than two separate vacuum chambers. It is merely essential that before the CdTe layer or the CdTe partial layers a CdS layer is deposited on the TCO layer acting as a frontal contact, whereby chemically non-bound oxygen is embedded in the CdS layer. In this way, CdTe solar cells can be produced which are characterized by a high photocurrent and high open-circuit voltage.

The invention claimed is:

1. A method for producing a CdTe solar cell, the method comprising:
   depositing at least the following layers on a glass substrate: a TCO layer acting as a front contact; at least one CdTe layer; a thin layer of a chlorine-containing compound; and an electrically conductive layer acting as back contact, wherein before the deposition of the at least one CdTe layer, a passivation layer with a maximum thickness of 20 nm is deposited by sublimation of CdS, wherein the CdS used for depositing the passivation layer is thermally heated until it sublimates, and the passivation layer is deposited in the presence of an oxygen plasma, the passivation layer comprising CdS in which chemically non-bound oxygen is embedded.

2. The method of claim 1, wherein the oxygen plasma is generated by means of a glow discharge or arc discharge.

* * * * *